United States Patent

Ohtake et al.

[11] Patent Number: 6,054,063
[45] Date of Patent: Apr. 25, 2000

[54] METHOD FOR PLASMA TREATMENT AND APPARATUS FOR PLASMA TREATMENT

[75] Inventors: Hiroto Ohtake; Seiji Samukawa, both of Tokyo, Japan

[73] Assignee: NEC Corporation, Tokyo, Japan

[21] Appl. No.: 09/100,749

[22] Filed: Jun. 22, 1998

[30] Foreign Application Priority Data

Jun. 24, 1997 [JP] Japan ................................ 9-167523

[51] Int. Cl.$^7$ .................................................. C23F 1/00
[52] U.S. Cl. .............................. 216/70; 156/345; 117/92; 117/103; 117/108; 118/706; 118/723 R; 118/723 MW; 118/723 MA
[58] Field of Search .................... 216/67, 68, 70; 118/723 R, 723 MW, 723 MA, 723 MR, 723 ER, 723 IR, 50.1; 156/345; 438/469, 714; 117/92, 103, 108

[56] References Cited

U.S. PATENT DOCUMENTS

| | | | |
|---|---|---|---|
| 4,764,394 | 8/1988 | Conrad | 427/525 |
| 4,808,258 | 2/1989 | Otsubo et al. | 156/643 |
| 5,296,272 | 3/1994 | Matossian et al. | 427/523 |
| 5,508,227 | 4/1996 | Cham et al. | 438/798 |
| 5,662,819 | 9/1997 | Kadomura | 438/711 |
| 5,779,925 | 7/1998 | Hashomito et al. | 216/67 |

FOREIGN PATENT DOCUMENTS

| | | |
|---|---|---|
| 1-225042 | 9/1989 | Japan . |
| 2-312227 | 12/1990 | Japan . |
| 4-180569 | 6/1992 | Japan . |
| 5-156453 | 6/1993 | Japan . |
| 6-342769 | 12/1994 | Japan . |
| 7-249614 | 9/1995 | Japan . |
| 7-288191 | 10/1995 | Japan . |

OTHER PUBLICATIONS

English Abstract of Japanese Patent Application No. 56–155535, published Dec. 1, 1981.
English Abstract of Japanese Patent Application No. 5–334488, published Dec. 17, 1993.

Primary Examiner—Randy Gulakowski
Assistant Examiner—Allan Olsen
Attorney, Agent, or Firm—Sughrue, Mion, Zinn, Macpeak & Seas, PLLC

[57] ABSTRACT

The high-frequency electric field is subjected to pulse modulation for 10 to 100 μsec; the rise time of pulse is controlled to be not shorter than 2 μsec but not longer than 50 μsec; and the descent time of pulse is controlled to be not shorter than 10 μsec but not longer than φμsec. Thereby, the electron temperature in plasma is controlled at 2 eV or lower and the fluctuation of the density of negative ion in plasma is controlled at 20% or smaller.

13 Claims, 5 Drawing Sheets

SPEED OF POSITIVE ION   SPEED OF ELECTRON

METHOD FOR PLASMA TREATMENT AND APPARATUS FOR PLASMA TREATMENT

BACKGROUND OF THE INVENTION

1. Field of the Invention

The present invention relates to the surface treatment of substrate. More particularly, the present invention relates to a method for plasma treatment of substrate, which comprises treating the surface of a substrate with a plasma generated using a pulse-modulated high-frequency electric field; as well as to an apparatus for plasma treatment of substrate.

2. Description of the Related Art

Conventional apparatuses for microwave plasma etching have, for example, a structure of FIG. 10 disclosed in Japanese Patent Application Kokai (Laid-Open) No. 155535/1981. In this apparatus, an etching treatment for substrate is conducted by introducing a microwave of about 2.45 GHz into a plasma-generating chamber 1 of gastight structure from a microwave electric source 3 through a waveguide 2, allowing the microwave and a magnetic field of a permanent magnet or coil 6 to act on a raw material gas to generate an electron cyclotron resonance discharge plasma 7, placing a substrate 9 (a raw material to be etched) in the plasma 7, and applying a bias of several hundreds of KHz to several tens of MHz to the substrate 9.

T he above apparatus is used under continuous discharging. In using this apparatus for the purpose of the surface treatment of a substrate, there was the following problem. That is, since there is a difference in speed between electron (negatively charged) and positive ion (positively charged) as shown in FIG. 2, negative charges are accumulated on the substrate, whereby the substrate is damaged. In order to suppress this charge accumulation, surface treatment of the substrate using pulse-modulated plasma was proposed in, for example, Japanese Patent Application Kokai (Laid-open) No. 334488/1993.

In the surface treatment of a substrate using pulse-modulated plasma, charge accumulation on the substrate can be reduced by subjecting a high-frequency electric field to pulse modulation for 10 to 100 μsec to reduce the electron temperature during the OFF time of the high-frequency electric field, as shown in FIG. 3. Further, high-speed etching can be expected in a halogen-based or oxygen plasma generated from chlorine, carbon tetrafluoride, sulfur hexafluoride, oxalic acid or the like because, in such a plasma, a negative ion is generated by pulse discharging, making possible etching both by positive ions and negative ions.

Furthermore, charge accumulation on the substrate can be almost completely eliminated by allowing the negative ion generated in plasma at low electron temperatures, to hit a substrate, together with a positive ion, at a low-frequency bias of 600 KHz or less. FIG. 4 shows dependency of accumulated charge on pulse OFF time in chlorine ECR plasma. Charge accumulation can be suppressed when the OFF time is 50 μsec or more and the amount of negative ion generated is large. Thus, when the electron temperature and electron density are low and the plasma is constituted by positive and negative ions and, under such conditions, a low-frequency RF bias is applied to a substrate, the positive and negative ions hit the substrate alternately and charge accumulation on the substrate can be suppressed.

The above conventional techniques, however, still have a room for improvement because the electron temperature in plasma makes a sharp increase when a pulse is applied, making it difficult to keep the electron temperature sufficiently low and making impossible the thorough elimination of charge accumulation on the substrate. Further, there was a problem to be solved because the negative ion in halogen-based or oxygen plasma generated from chlorine, carbon tetrafluoride, sulfur hexafluoride, oxalic acid or the like decreases at the time of high-frequency application, allowing charge accumulation to take place easily at the time of pulse application.

FIG. 5 shows the change of electron temperature with time when a pulse is applied in a chlorine plasma. A negative ion shows overshoot in about 10 μsec after the power is turned ON, under the conditions of microwave power of 500 W, and chlorine pressure of 2 mTorr, and the electron temperature reaches about 4 eV. This is brought about by the inflow of highenergy electron caused by electrons cyclotron resonance. It indicates that when a rectangular pulse is applied, there is a periodical sharp rise for about 10 μsec from the moment of pulse application.

FIG. 6 shows dependency of Si etching rate on the length of pulse application time (hereinafter referred to as pulse width) when an RF bias of 600 KHz is applied to a substrate in a chlorine plasma. When the pulse width is 30 μsec or more, the etching rate decreases as the pulse width increases, even if the pulse OFF time is fixed. This is because the density of negative ions decreases with an increase in electron temperature, at the time of pulse application. When the pulse width is 10 μsec, the etching rate is lower than when the pulse width is 30 μsec. This is because the plasma density itself is lower owing to a lower duty ratio. Therefore, it is clear that a shorter pulse ON time generates a larger amount of a negative ion but a very short pulse ON time decreases the amount.

SUMMARY OF THE INVENTION

The present invention has been completed in order to alleviate the above-mentioned problems of the prior art. In the present invention, it is intended that in a pulse-modulated plasma, (1) the overshoot of electron temperature is suppressed and electron temperature is lowered stably by allowing the applied pulse to have an inclination during the rise and (2) the decrease of negative ion is suppressed by allowing the pulse to have an inclination during the descent.

According to the present invention, there are provided:
a method for plasma treatment of substrate, which comprises converting, in a plasma-generating chamber, a raw material gas into a plasma using a high-frequency electric field and applying the plasma onto a substrate to treat the substrate, in which method the high-frequency electric field is subjected to plasma modulation for 10 to 100 μsec, the electron temperature in the plasma is controlled at 2 eV or less, and the fluctuation of the density of negative ions in the plasma is controlled at 20% or less, and an apparatus for plasma-treating a substrate by converting, in a plasma-generating chamber, a raw material gas into a plasma using a pulse-modulated high-frequency electric field and applying the plasma onto the substrate to treat the substrate, which apparatus has a means for applying a magnetic field, an RF electric source for applying the RF electric field into the plasma-generating chamber, and a means for subjecting the high-frequency electric field to pulse modulation for 10 to 100 μsec and also controlling the rise time and descent time of the pulse.

In the present invention, the amount of negative ions in plasma can be increased, and charge accumulation can be reduced.

Suppressing of the overshoot of electron temperature can be achieved by allowing the applied pulse to have an inclination during the rise. That causes the amount of negative ions in the plasma increase, and the charge accumulation to decrease reduced. This is because no large power is applied to the plasma during pulse application and the generation of high-energy electrons is suppressed. Increase in the amount of electrons having an energy of 1 eV or less produces negative ions efficiently in after-glow, resulting in increase in the amount of negative ions. Therefore, the electron temperature and the electron density are low and a plasma comprising positive and negative ions alone is generated stably, making possible reduction in charge accumulation.

Also in the present invention, the applied pulse may be allowed to have an inclination during the descent to suppress the decrease in negative ion density during the pulse ON time. A short pulse ON time is preferred because the negative ion decreases during the pulse ON time; too short a pulse ON time, however, makes difficult the keeping of plasma; therefore, increase in power applied per unit time and shortening of pulse ON time can achieve an increase in the density of negative ions. Thus, according to the present invention, damage to the substrate caused by charge accumulation thereon can be suppressed and, simultaneously therewith, high-speed anisotropic etching can be conducted.

DETAILED DESCRIPTION OF THE PREFERRED EMBODIMENTS

In the method for plasma treatment according to the present invention, a high-frequency electric field is subjected to pulse modulation for 10 to 100 $\mu$sec, whereby the electron temperature of plasma is lowered during the OFF time of high-frequency electric field and moreover high-speed etching by positive ions and negative ion is made possible.

In the present method for plasma treatment, the electron temperature of plasma during plasma treatment is controlled at 2 eV or lower. The reason is that when the electron temperature is higher than 2 eV, there may arise problems such as damaging of the substrate caused by charges accumulated thereon. Further, the electron temperature of plasma during plasma treatment is controlled preferably at 0.5 eV or higher. The reason is that when the electron temperature is lower than 0.5 eV, it may be difficult to maintain discharging.

Figure 7:
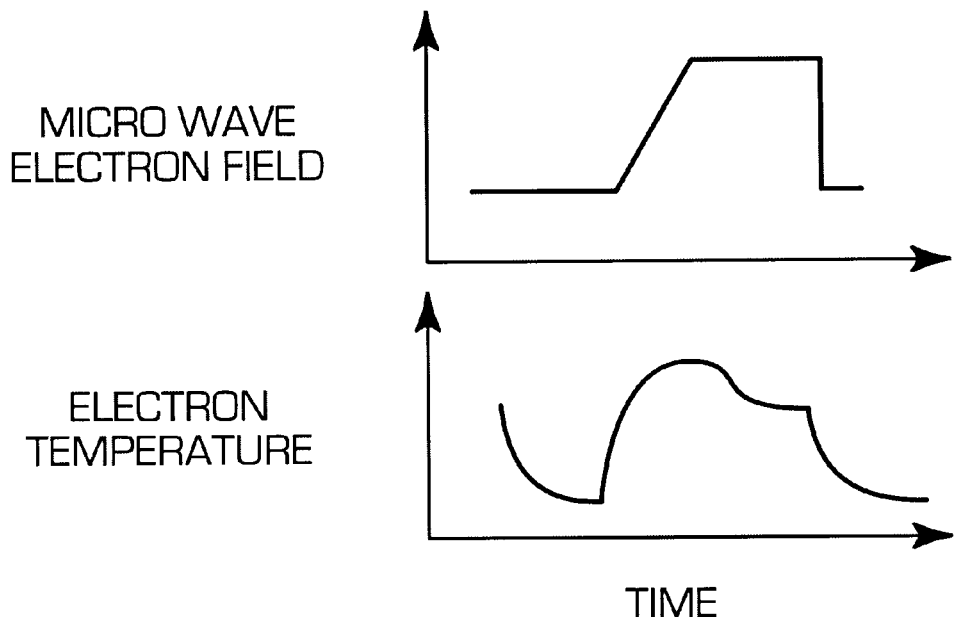
FIG. 7 is a drawing showing the relation of the pulse shape of a high-frequency electric field and the change of electron temperature or negative ion density, in the present plasma treatment method.

In order to control the electron temperature at 2 eV or lower, it is effective to allow the pulse to have a rise time and have an inclination in the rise by the use of a pulse circuit, as shown in FIG. 7 (upper). Thereby, it becomes possible to suppress the overshoot of electron temperature, as shown in FIG. 7 (lower), and control the electron temperature at 2 eV or lower.

Figure 9:
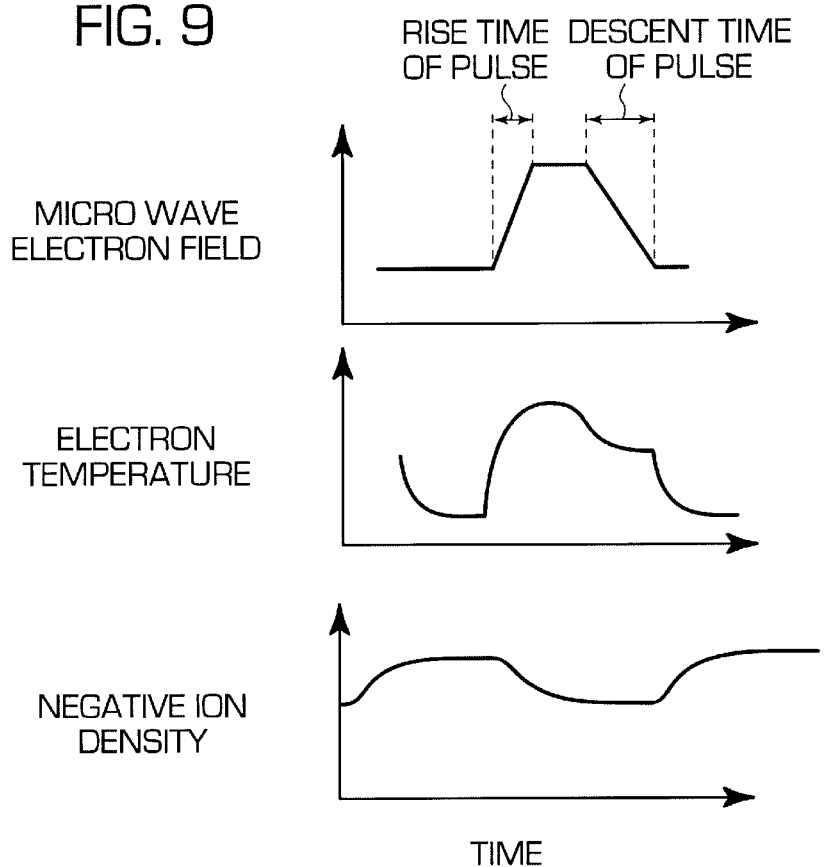
FIG. 9 is a drawing showing the relation of the pulse shape of a high-frequency electric field and the change of electron temperature or negative ion density, in the present plasma treatment method.
Figure 10:
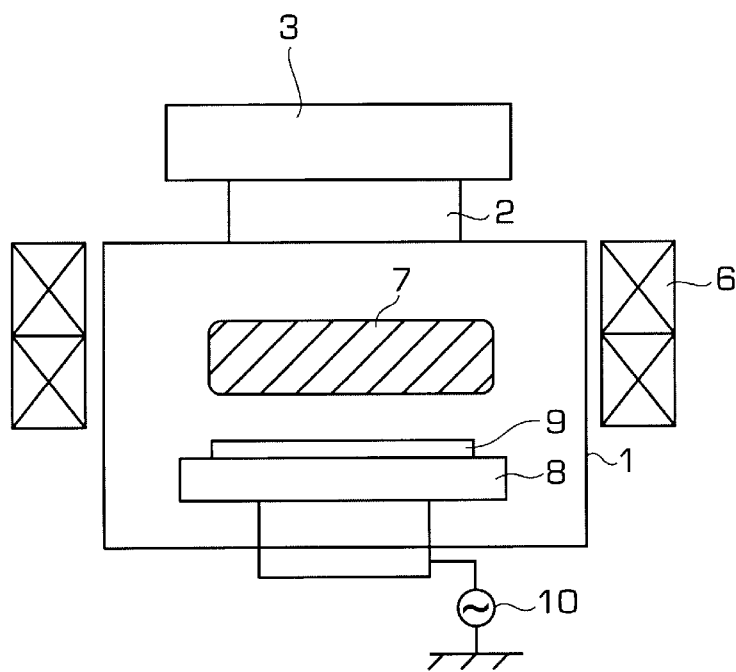
FIG. 10 is a schematic drawing of a conventional plasma treatment apparatus.

Herein, the "rise time" of the pulse refers to a time required to put the high-frequency electric field in an ON state, as shown in FIG. 9. The rise time of the pulse is controlled to be 2 to 50 $\mu$sec, preferably 5 to 20 $\mu$sec. When the rise time is shorter than 2 $\mu$sec, it is difficult to suppress the overshoot of electron temperature. When the rise time is longer than 50 $\mu$sec, the total density of plasma is low and there may arise problems such as reduction in etching speed.

Further in the plasma treatment method of the present invention, the fluctuation of the density of negative ions of plasma during plasma treatment is controlled to be 20% or smaller. When the fluctuation is larger than 20%, there may arise problems such as damaging of the substrate caused by charges accumulated thereon.

Figure 8:
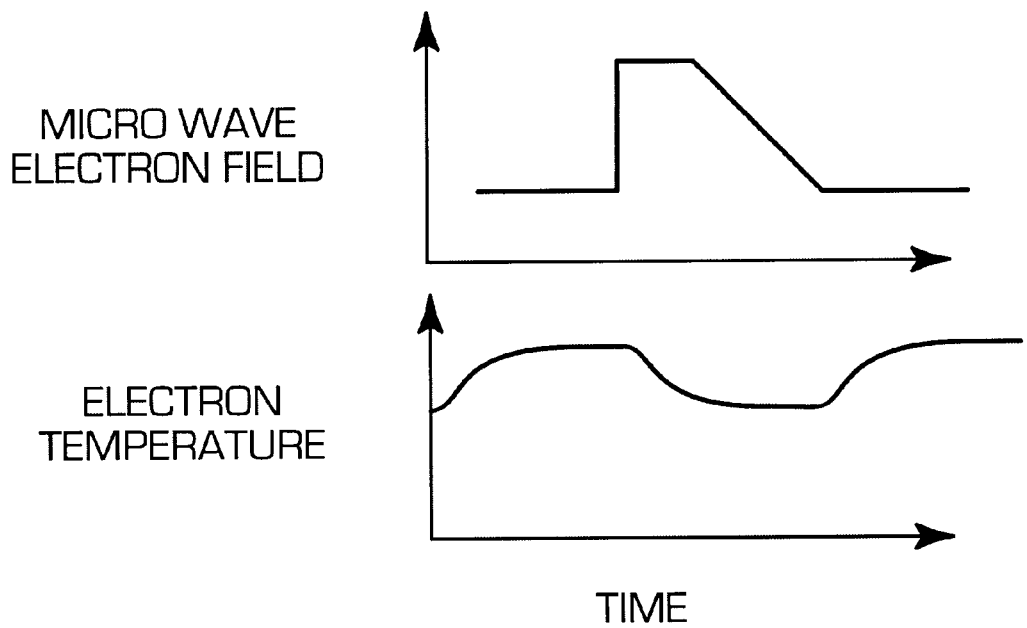
FIG. 8 is a drawing showing the relation of the pulse shape of a high-frequency electric field and the change of electron temperature or negative ion density, in the present plasma treatment method.

In order to keep the fluctuation of the density of negative ions at 20% or smaller, it is effective to allow the pulse to have a descent time and have an inclination in the descent by the use of a pulse circuit, as shown in FIG. 8. Allowing the pulse to have a descent time cause the time of the ON state to be shorter. Therefore a decrease in negative ion can be suppressed. By allowing the pulse to have an inclination in the descent, applied power can be kept at a high average level. Therefore a decrease in plasma density can be suppressed. Herein, the "descent time" of the pulse refers to a time required to put the high-frequency electric field in an OFF state, as shown in FIG. 9. The descent time of the pulse is controlled to be 10 to 100 $\mu$sec, preferably 20 to 50 $\mu$sec. When the descent time is shorter than 10 $\mu$sec, the ON time is long, making large the decrease in the density of negative ion. When the descent time is longer than 100 $\mu$sec, the total density of plasma is low and there may arise problems such as reduction in etching speed.

EXAMPLE 1

Figure 1:
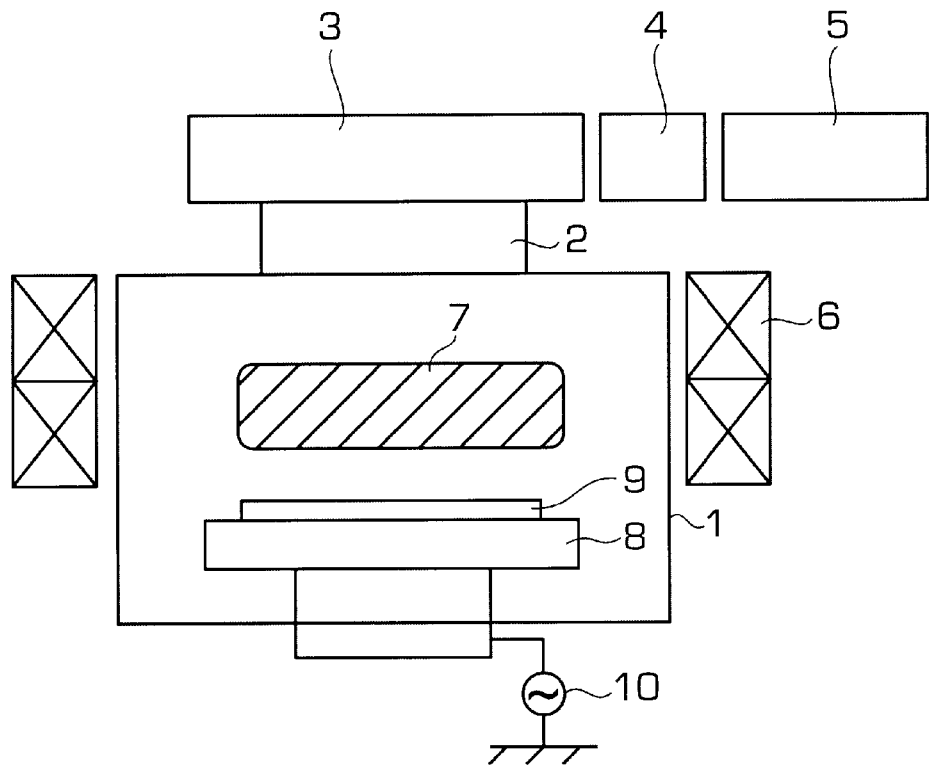
FIG. 1 is a schematic drawing of a plasma treatment apparatus of the present invention.
Figure 2:
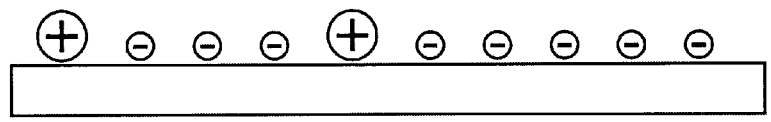
FIG. 2 is a drawing for explaining the accumulation of negative charge on a substrate in a conventional plasma treatment method.
Figure 3:
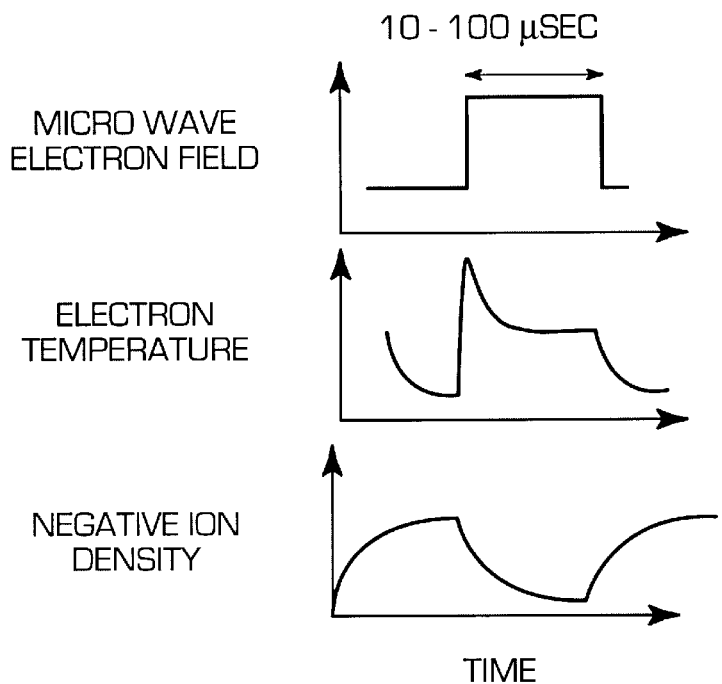
FIG. 3 is a drawing showing the relation of the pulse shape of high-frequency electric field and the change of a electron temperature or negative ion density, in a conventional plasma treatment method.
Figure 4:
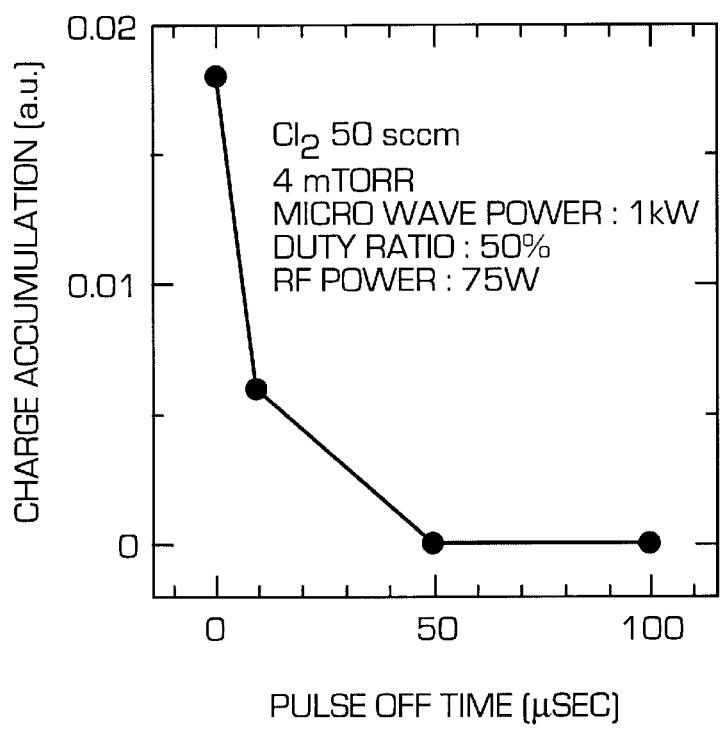
FIG. 4 is a drawing showing the relation of pulse OFF time and charge accumulation.
Figure 5:
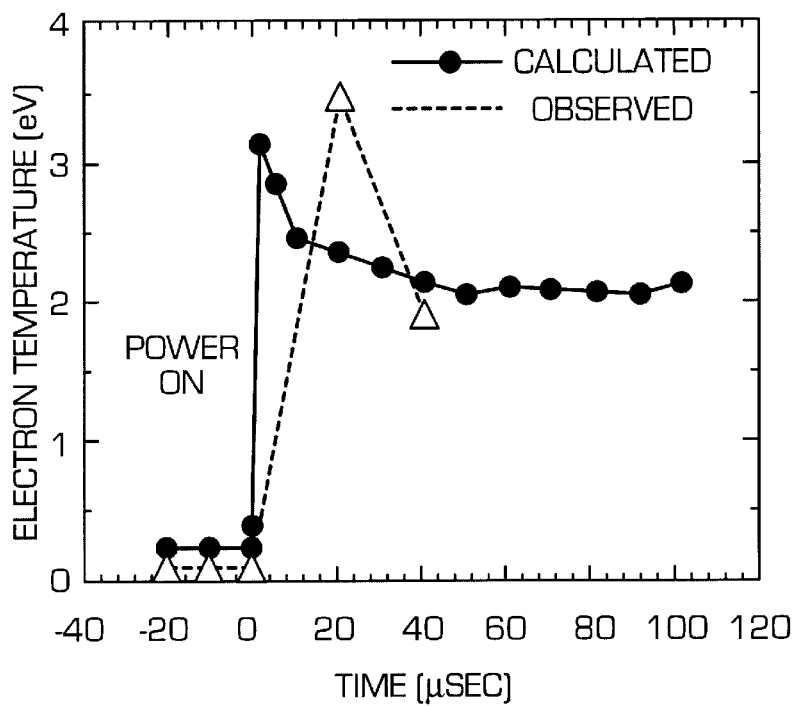
FIG. 5 is a drawing showing the change of electron temperature after the application of a high-frequency electric field.
Figure 6:
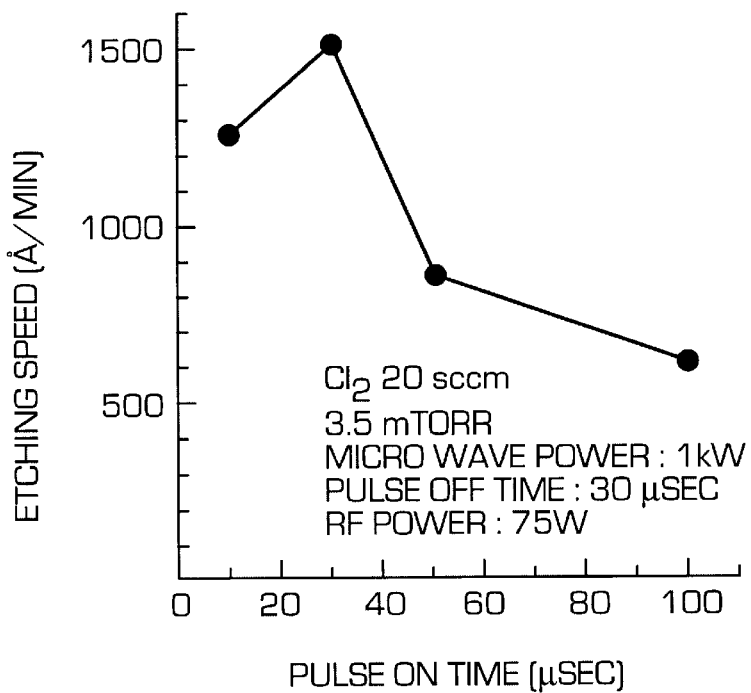
FIG. 6 is a drawing showing the relation of pulse OFF time and silicon etching speed.

The present invention is specifically described below by way of Example. FIG. 1 is a schematic view of the apparatus for plasma treatment used in the present invention. In this apparatus, a plasma 7 is generated in a plasma-generating chamber 1 by a microwave electric source 3 and a coil or permanent magnet 6; and a chamber for feeding a substrate is adjacent to the plasma-generating chamber 1. To the plasma-generating chamber 1 are connected a gas line for feeding a plasma-generating gas into the chamber 1 and a waveguide 2 for feeding a microwave of about 2.45 GHz into the chamber 1. As the gas, there is used a substance which produces a large amount of a negative ion during the power OFF time. There is used, for example, carbon tetrafluoride, sulfur hexafluoride, oxalic acid or the like. A substrate 9, which is a sample to be etched, is placed on a substrate electrode 8. The substrate electrode 8 is connected to an RF electric source 10.

The apparatus of FIG. 1 has a pulse circuit 4 and a function generator 5, both for subjecting a microwave from the microwave electric source 3 to pulse modulation. The rise time is set at, for example, 10 $\mu$sec and the descent time is set at, for example, 30 $\mu$sec, and a pulse having a shape shown in FIG. 9 is used. By thus appropriately combining a rise time and a descent time, it is possible to keep the electron temperature at 2 eV or lower and suppress the fluctuation of the density of negative ions at 20% or smaller.

Incidentally, the plasma treatment method of the present invention can be applied independently of the frequency and type of discharging.

As described above, in the plasma treatment method of the present invention, the electron temperature in plasma is controlled at 2 eV or lower and the fluctuation of the density of negative ion is controlled at 20% or smaller; therefore, high speed, high selectivity and anisotropic etching can be realized with no charge accumulation.

What is claimed is:

1. A method for plasma treatment of a substrate, which comprises:

converting, in a plasma-generating chamber, a raw material gas into a plasma using a high-frequency electric field; and applying the plasma onto a substrate to treat the substrate;

in which method the high-frequency electric field is subjected to pulse modulation for 10 to 100 $\mu$sec, and the rise time of the pulse is selected so that the electron temperature in the plasma is controlled at 2 eV or lower, and the fluctuation of the density of negative ion in plasma is controlled at 20% or less.

2. A method for plasma treatment of a substrate according to claim 1, wherein the rise time of the pulse is controlled to be 2–50 $\mu$sec.

3. A method for plasma treatment of a substrate according to claim 1, wherein the descent time of the pulse is controlled to be 20–50 $\mu$sec.

4. An apparatus for plasma-treating a substrate by converting, in a plasma-generating chamber, a raw material gas into a plasma using a pulse-modulated high-frequency electric field and applying the plasma onto the substrate to treat the substrate, which apparatus has a means for applying a magnetic field, an RF electric source for applying the RF electric field into the plasma-generating chamber, and a means for subjecting the high-frequency electric field to pulse modulation for 10 to 100 $\mu$sec and also controlling the rise time and descent time of pulse such that the electron temperature of the plasma is controlled to be 2 eV or lower.

5. An apparatus for plasma treating a substrate, comprising:

a container having raw material gas and a substrate disposed therein;

a generator for supplying a high frequency electric field to the raw material gas to provide a plasma for plasma-treating the substrate;

a pulse circuit for turning on and off the high frequency electric field; and a function generator for applying a function to the pulse circuit to control a rise time and a descent time of the high frequency electric field so that the electron temperature of the plasma is controlled to be 2 eV or lower.

6. The apparatus set forth in claim 5, wherein the pulse circuit pulses the high frequency electric field so that the on time of the high frequency electric field is between 10 and 100 $\mu$sec.

7. The apparatus as set forth in claim 6, wherein the function generator generates a function which causes the rise time of the high frequency electric field to be between 2 and 50 $\mu$sec.

8. The apparatus as set forth in claim 7, wherein the function generator generates a function which causes the descent time of the high frequency to be between 20 and 50 $\mu$sec.

9. The apparatus as set forth in claim 5, wherein the high frequency field converts the raw material gas into plasma for plasma-treating the substrate.

10. The apparatus as set forth in claim 9, wherein the function output by said function generator is such that fluctuation of negative ions in the plasma is not greater than 20%.

11. The method as set forth in claim 1, wherein the electron temperature is controlled within the range of 0.5 eV to 2 eV.

12. The apparatus as set forth in claim 4, wherein the electron temperature is controlled within the range of 0.5 eV to 2 eV.

13. The apparatus as set forth in claim 5, wherein the electron temperature is controlled within the range of 0.5 eV to 2 eV.

* * * * *